United States Patent [19]

Yamamoto et al.

[11] Patent Number: 5,699,018
[45] Date of Patent: Dec. 16, 1997

[54] NEGATIVE VOLTAGE GENERATOR

[75] Inventors: Kazuya Yamamoto; Kosei Maemura, both of Tokyo, Japan

[73] Assignee: Mitsubishi Denki Kabushiki Kaisha, Tokyo, Japan

[21] Appl. No.: 642,262

[22] Filed: May 3, 1996

[30] Foreign Application Priority Data

Dec. 8, 1995 [JP] Japan ..................... 7-320216

[51] Int. Cl.$^6$ .................. H03F 3/04; G05F 1/10
[52] U.S. Cl. ........................... 330/297; 327/536
[58] Field of Search ..................... 327/530, 536, 327/537, 543; 330/296, 297

[56] References Cited

U.S. PATENT DOCUMENTS

| | | | |
|---|---|---|---|
| 4,794,278 | 12/1988 | Vajdic | 327/536 X |
| 5,180,928 | 1/1993 | Choi | 327/536 X |
| 5,532,640 | 7/1996 | Okunaga | 327/536 X |

OTHER PUBLICATIONS

"Development of a Monolithic Negative Voltage Generator IC for Gain Controlled MMIC Amplifiers" Technical Report of IEICE.ED94–135, pp. 43–49, Jan. 19, 1995.

*Primary Examiner*—Steven Mottola
*Attorney, Agent, or Firm*—Leydig, Voit & Mayer, Ltd.

[57] ABSTRACT

An output voltage of a negative voltage generator contains a ripple because of a ripple occurring in a voltage produced by a charge pump circuit in the negative voltage generator. When the negative voltage is supplied to an FET amplifier, there arises a possibility that an unwanted spurious component occurs in an output of the FET amplifier. Since each of pair of circuits, that generate a negative voltage, are made mutually complementary, two charge pump circuits are used to cancel ripples. A ripple appearing in an output voltage can therefore be suppressed, and a negative voltage can eventually be supplied more stably. When the negative voltage generator is connected to, for example, an FET amplifier in order to supply a gate bias voltage to each FET in the FET amplifier, an unwanted spurious component that may be contained in an output of the FET amplifier can be removed.

12 Claims, 12 Drawing Sheets

NVG 1

MODE I

MODE II $\Delta V = Q/C_1 = I_0/(f \cdot C_1)$

4a

10

NEGATIVE VOLTAGE GENERATOR

BACKGROUND OF THE INVENTION

1. Field of the Invention

The present invention relates to a negative voltage generator for supplying a negative voltage to a gate bias voltage, such as, a GaAs FET amplifier (an amplifier employing gallium arsenide field-effect transistors).

2. Description of the Related Art

In recent years, the market for mobile communications using an analog modulation technique or digital modulation technique has rapidly been growing due to the prevalence of super-compact portable telephones. In such a super-compact portable telephone, a battery is used as a power supply and it is important to prolong telephone usage consumption.

In particular, a high-power amplifier for filling the role of amplifying a signal to the level of an antenna output occupies a large share (about 70 to 80%) of a total power consumption of a portable telephone. In general, a high-power amplifier formed with a GaAs FET which can operate more efficiently than silicon (Si) transistors is more widely adopted.

The amplifier employing GaAs FETs usually needs a negative voltage as a gate bias voltage. For example, when the pinch-off voltage Vp of an FET is −2 V, a gate bias voltage Vgs that ranges from −1.0 to −1.5 V must be applied in order to attain a class-AB operation that enables a highly-efficient operation. For use of the GaAs FET amplifier, a negative power supply is needed in addition to a positive power supply.

In a portable telephone, a DC-DC converter (negative voltage generator) of a charge pumping type which is generally formed with a silicon (Si) CMOS integrated circuit is used as a compact and lightweight negative power supply. The negative voltage generator of a charge pumping type is used because the current required for the negative power supply is small, between several hundreds microamperes to several milliamperes (only for a gate current of a GaAs FET amplifier), and the charge pump technique makes it possible to design a circuit simply and compactly.

FIG. 11 shows an example of a GaAs FET amplifier and negative voltage generator. In FIG. 11, AMP denotes a GaAs FET amplifier. NVG denotes a negative voltage generator. IN and OUT denote input and output terminals of the amplifier AMP. The amplifier AMP is, for example, composed of three stages of amplifiers AMP1 to AMP3. The negative voltage generator NVG supplies gate bias voltages Vg1 to Vg3 to the respective amplifiers.

FIG. 12 shows the typical circuitry of the negative voltage generator shown in FIG. 11. In FIG. 12, reference numeral 1 denotes an oscillator or an external input signal buffer for transmitting a low-level signal fed externally to the next stage (hereinafter oscillator buffer). Reference numeral 2 denotes a drive circuit for amplifying the amplitude of a signal received from the oscillator buffer 1 to an appropriate output amplitude. Reference numeral 3 denotes a charge pump circuit for converting a positive voltage into a negative voltage Vss. Finally, reference numeral 4 denotes a level control circuit for converting the level of the negative voltage Vss to the level of an appropriate gate bias voltage Vg (Vss<Vg<0 V).

FIG. 13 shows a conventional negative voltage generator described in, for example, "Development of a Monolithic Negative Voltage Generating IC Usable as a Gain-variable MMIC" in the Technical Research Report (Vol.94, No. 429, ED94-135, MW92-122, ICD94-197) published by the Institute of Electronic Information Communications. The negative voltage generator is connected to a gain-variable amplifier.

In FIG. 13, reference numeral 1A denotes a radio-frequency (hereinafter RF) oscillating unit comparable to the oscillator buffer 1 in FIG. 12. Section 2B in a polarity reversing unit is a drive circuit. Section 3C is a charge pump circuit. The drive circuit and charge pump circuit are comparable to the drive circuit 2 and charge pump circuit 3 in FIG. 12. Reference numeral 4D denotes a voltage control unit comparable to the level control circuit 4 in FIG. 12.

Q1 and Q2 denote FETs constituting constant-current sources. Vss denotes a stored negative voltage. Vg1 and Vg2 denote output voltages that are used as gate bias voltages of the FETs constituting a gain-variable amplifier. I1, I2, Iss1, and Iss2 denote current flow illustrated in the branch circuits of the generator. Ig1 and Ig2 denote output currents. This generator provides two output voltages Vg1 and Vg2, which supply negative voltages to a three-stage gain-variable amplifier, such as the one shown in FIG. 11.

When a negative voltage generator such as the one shown in FIG. 13 is connected to a GaAs FET amplifier and used, problems occur.

FIG. 14 shows the input/output characteristics of a typical GaAs FET. The abscissa indicates an input power Pin, the left-hand ordinate indicates an output power Pout, and the right-hand axis of ordinates indicates a gate current Ig. As shown in FIG. 14, when the input power Pin increases, if the characteristic curve of the output power Pout comes from a linear area A to a compression area B corresponding to the conditions under which the gate current Ig is compressed, a negative current flows into the FET in relation to the gate resistance of the FET. In other words, a current flows in a direction receding from the gate terminal of the FET. A large gate current flows in an FET having a lower gate resistance under the conditions corresponding to the compression area.

For example, for the voltage control unit 4D (level control circuit 4) shown in FIG. 13, if the voltage control unit 4D is used under the conditions that do not permit the gate currents Ig1 and Ig2 to flow, then the output voltages Vg1 and Vg2 have a set value. As for what is used under the conditions corresponding to the compression area of the input/output characteristics, such as, an FET amplifier, the gate currents Ig1 and Ig2 flow while having the values indicated in FIG. 14. The output voltages Vg1 and Vg2 vary compared with those provided when the gate currents Ig1 and Ig2 do not flow.

This variation occurs in the circuitry shown in FIG. 13 as described below. In FIG. 13, since the FETs Q1 and Q2 serve as constant-current sources, the following relationships are established:

$$Iss1=Ig1+I1=\text{constant}$$

$$Iss2=Ig2+I2=\text{constant} \quad (1)$$

When the gate currents do not flow, the Ig1 and Ig2 values are zero and the above expressions are rewritten as follows:

$$Iss1=I1, \ Iss2=I2 \quad (2)$$

The output voltages Vg1 and Vg2 provided this time are dependent on voltage drops induced by a supply voltage VDDN and currents I1 and I2.

When the gate currents flow, the following expressions are derived from the expressions (1):

$I1 < Iss1, I2 < Iss2$ (3)

This means that voltage drops induced by the currents I1 and I2 get smaller. The output voltages Vg1 and Vg2 get higher than those provided when the gate currents do not flow and FIG. 15 shows the foregoing relationships.

As mentioned above, there is a problem when the output voltages Vg1 and Vg2 are greatly different when gate bias voltages are set without the input of an RF signal from a GaAs FET amplifier and when amplification is performed with the input of the RF signal.

In addition, the output voltages Vg1 and Vg2 are output by converting the level of a negative voltage Vss stored by the charge pump circuit 3C. At this time, a ripple (the principle of occurrence of a ripple will be described later) induced by the charge pump circuit 3C appears in the negative voltage Vss and output voltages Vg1 and Vg2. When the ripple is large, the gate voltages Vg1 and Vg2 of an FET amplifier vary in line with the ripple frequency. There arises a possibility that an output signal of the FET amplifier may contain an unwanted modulated component (spurious pulse). Assuming that the FET amplifier is employed in a digital modulation system, there is a possibility that the distorted component of a modulated wave may expand.

The ripple becomes more obvious when the capacitance of a smoothing capacitor in the charge pump circuit is smaller (for example, about several tens of picofarads).

As mentioned above, the known negative voltage generator does not have the circuitry suitable for supplying a negative gate bias voltage to a GaAs FET amplifier. A problem may arise when an output current (gate current) flows, an output voltage varies, or a ripple of a voltage is induced by a charge pump circuit because any of the above may cause an unwanted spurious component to appear in an output of the FET amplifier.

SUMMARY OF THE INVENTION

The present invention attempts to solve the foregoing problems. An object of the present invention is to provide a negative voltage generator capable of supplying a more stable negative voltage.

Accordingly, the first aspect of the present invention lies in a negative voltage generator comprising: an oscillating signal means for providing an oscillating signal and its complementary signal; a negative voltage generating means for amplifying the oscillating signal and complementary signal provided by the oscillating signal means, combining signals produced by reversing the polarities of the resultant signals, and thus generating a negative voltage; and a level control means for converting the level of the negative voltage into a desired level and supplying a resultant voltage as an output voltage.

The second aspect of the present invention lies in a negative voltage generator in accordance with the first aspect of the present invention, wherein the negative voltage generating means includes a pair of drive circuits for amplifying the oscillating signal, and complementary signal respectively, and a pair of charge pump circuits that reverse the polarities of the outputs of the drive circuits and have output terminals thereof interconnected.

The third aspect of the present invention lies in a negative voltage generator in accordance with the first or second aspect of the present invention, wherein the level control means uses a transistor, which determines an output voltage using the level of the generated negative voltage as a common level, as a source follower having either a resistive load or constant-current load as a load in order to minimize the variation of the output voltage caused by an output current, and includes a current mirror for stabilizing the gate voltage of the transistor.

The fourth aspect of the present invention lies in a negative voltage generator in accordance with the third aspect of the present invention, wherein a branch circuit into which a constant current flows independently of the negative voltage owing to the current mirror and which is connected to the gate of the transistor is provided with an external input voltage terminal to which a voltage is applied externally in order to adjust an output voltage.

The fifth aspect of the present invention lies in a negative voltage generator in accordance with the third aspect of the present invention, wherein the branch circuit through which a constant current flows independently of the negative voltage owing to the current mirror is provided with two current distributing circuits each composed of an external input voltage terminal and resistor, so that a bias current in an FET amplifier can be adjusted when the negative voltage generator is connected to the FET amplifier in order to supply a negative voltage, and so that an output power can be regulated during amplification.

The sixth aspect of the present invention lies in a negative voltage generator comprising: an oscillating signal means for providing an oscillating signal; a negative voltage generating means for amplifying the oscillating signal provided by the oscillating signal means, reversing the polarity of the oscillating signal, and thus generating a negative voltage; and a level control means for converting the level of the negative voltage into a desired level and supplying a resultant voltage as an output voltage. The level control means uses a transistor, which determines an output voltage using the level of the generated negative voltage as a common level, as a source follower having either a resistive load or constant-current load as a load in order to minimize the variation of the output voltage caused by an output current, and includes a current mirror for stabilizing the gate voltage of the transistor.

The seventh aspect of the present invention lies in a negative voltage generator in accordance with the sixth aspect of the present invention, wherein a branch circuit through which a constant current flows independently of the negative voltage owing to the current mirror and which is connected to the gate of the transistor is provided with an external input voltage terminal to which a voltage is applied externally in order to adjust an output voltage.

The eighth aspect of the present invention lies in a negative voltage generator in accordance with the sixth aspect of the present invention, wherein the branch circuit through which a constant current flows independently of the negative voltage owing to the current mirror is provided with two current distributing circuits each composed of an external input voltage terminal and resistor, so that a bias current in an FET amplifier can be adjusted when the negative voltage generator is connected to the FET amplifier in order to supply a negative voltage, and so that an output power can be regulated during amplification.

The ninth aspect of the present invention is a negative voltage generator in accordance with the third or sixth aspect of the present invention, wherein the negative voltage generator is integrated with the FET amplifier, to which a negative voltage is supplied, using one chip, and aan FET serving as a constant-current unit in the current mirror is of the same kind as the FETs employed in the FET amplifier.

The tenth aspect of the present invention is a negative voltage generator in accordance with the fourth or seventh aspect of the present invention, wherein the negative voltage generator is integrated with the FET amplifier, to which a negative voltage is supplied, using one chip, a constant voltage supplying circuit composed of a resistor and constant-current unit and designed to apply a constant current is connected to the external input voltage terminal, and the FET serving as the constant-current unit in the current mirror is of the same kind as the FETs employed in the FET amplifier.

DETAILED DESCRIPTION OF THE PREFERRED EMBODIMENTS

First Embodiment

Figure 1:
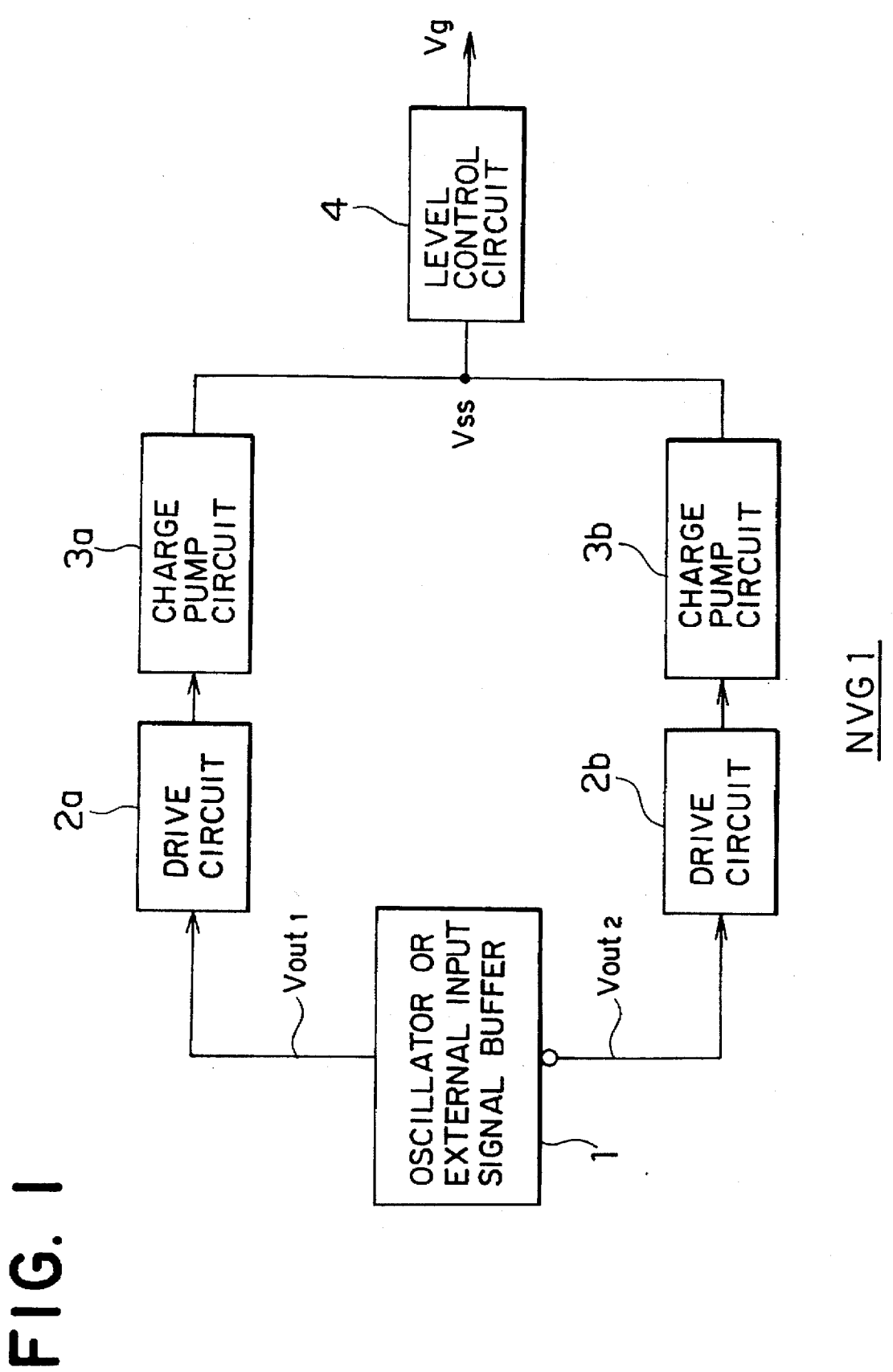
FIG. 1 is a block diagram of a negative voltage generator of the first embodiment.

FIG. 1 is a block diagram of a negative voltage generator in accordance with an embodiment of the present invention. The negative voltage generator minimizes, in particular, a ripple contained in a stored negative voltage or output voltage.

In a negative voltage generator NVG1 shown in FIG. 1, reference numeral 1 denotes an oscillator or external input signal buffer (hereinafter oscillator buffer). Reference Numerals 2a and 2b denote drive circuits for amplifying the amplitudes of outputs of the oscillator buffer 1 to an appropriate amplitude. Reference Numerals 3a and 3b denote charge pump circuits. Reference Numerals 4 denotes a level control circuit for converting in level a negative voltage Vss into an appropriate voltage Vg. Outputs Vout1 and Vout2 (=Vout1 bar) of the oscillator buffer 1 are mutually complementary. The charge pump circuits 3a and 3b operate in a mutually complementary manner.

Figure 2:
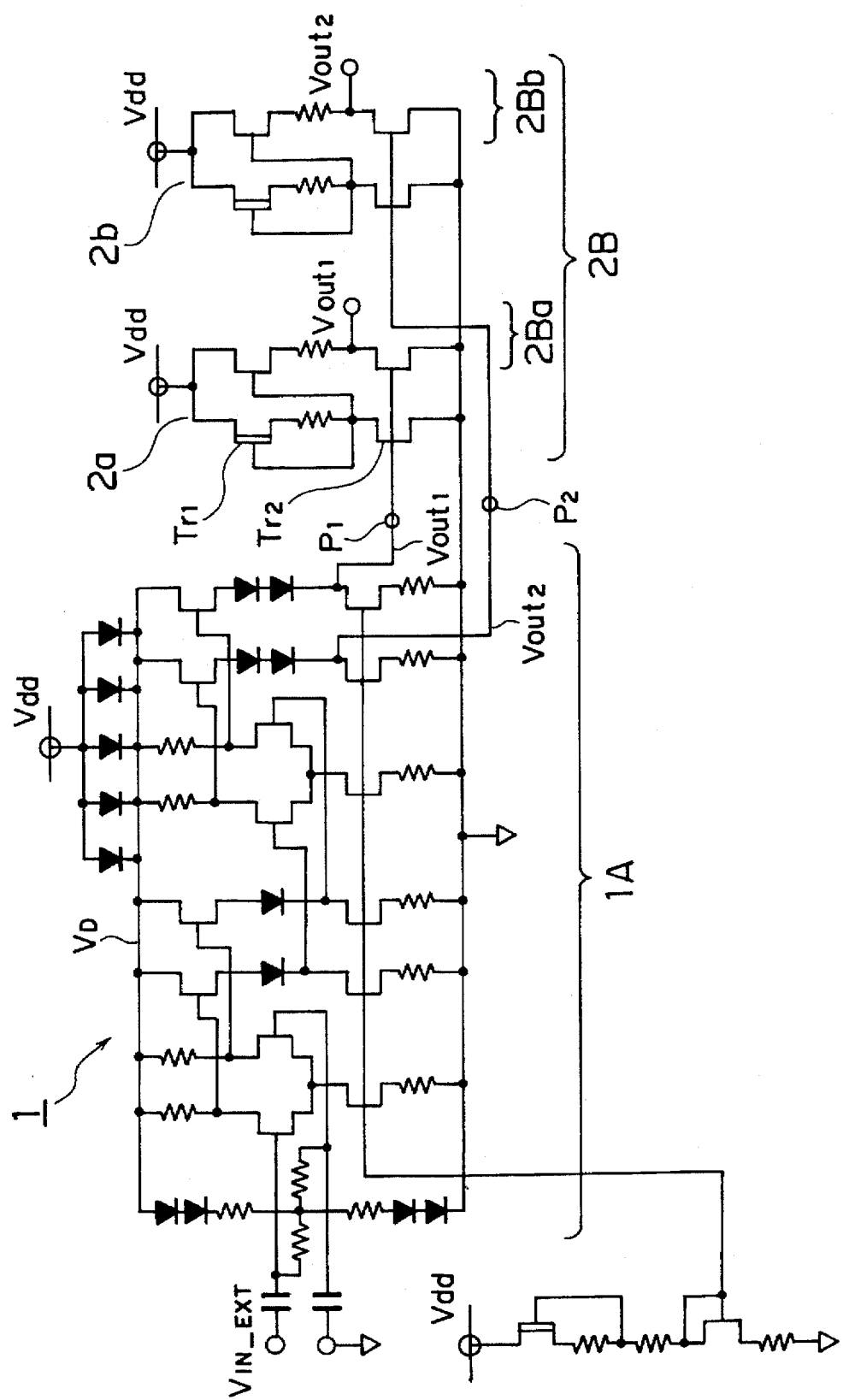
FIG. 2 is a circuit diagram showing an example of the circuitry of an external input signal buffer and drive circuit in the first embodiment.

FIG. 2 shows an example of the circuitry of the oscillator buffer 1 and drive circuits 2a and 2b shown in FIG. 1. A section 1A is an external input signal buffer employed in the oscillator buffer 1 shown in FIG. 1. $V_{IN\_EXT}$ denotes an external input signal. A section 2B is composed of the drive circuits 1a and 2b shown in FIG. 1.

Figure 3A:
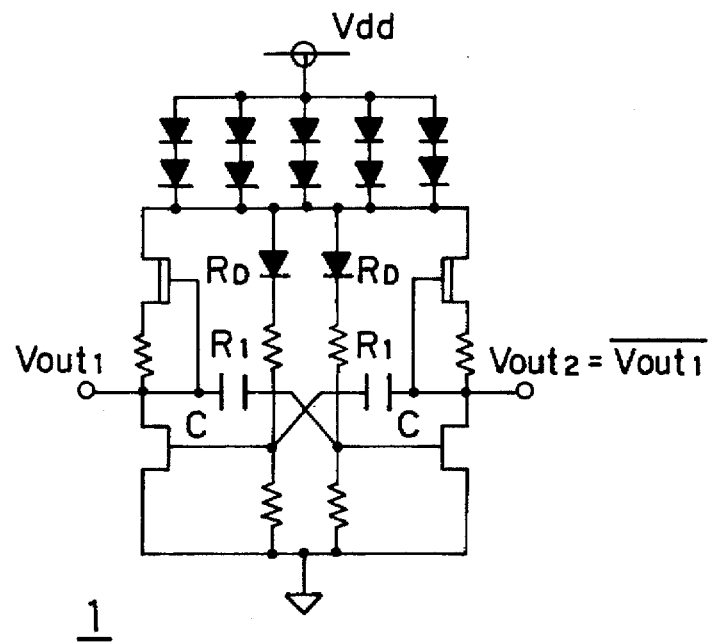
FIGS. 3A and 3B are circuit diagrams showing examples of the circuitry of an oscillator in the first embodiment.
Figure 3B:
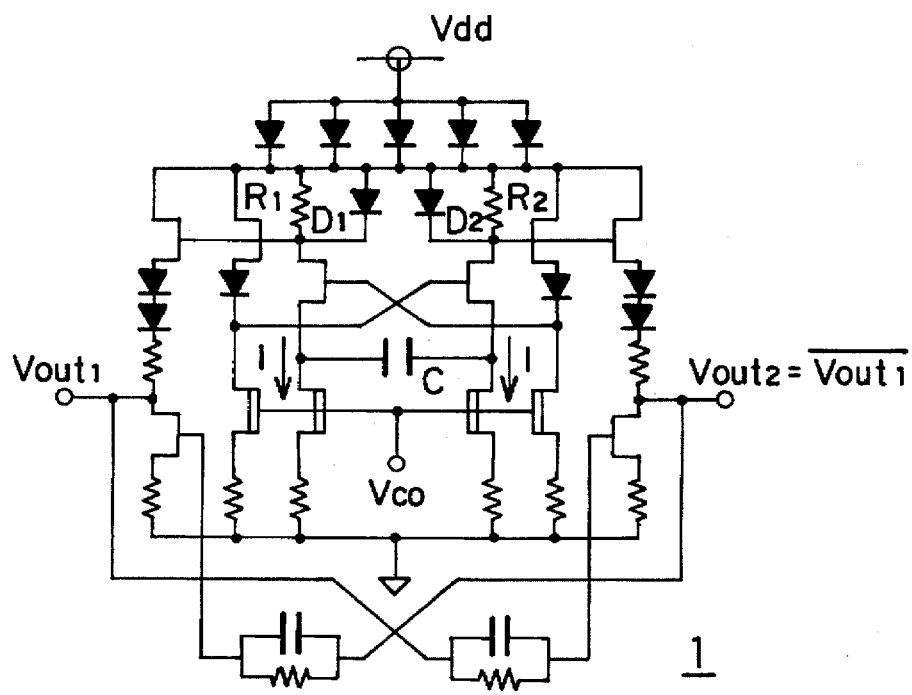

In FIG. 2, the input signal $V_{IN\_EXT}$ is received externally. Oscillators, shown in FIGS. 3A and 3B, may be installed in place of section 1A, thus, configuring a negative voltage generator with a built-in oscillator. FIG. 3A shows an example of a typical multivibrator, while FIG. 3B shows an example of a source-coupled multivibrator. Output terminals Vout1 and Vout2 (=Vout1 bar) of each of these multivibrators are connected to terminals P1 and P2 in FIG. 2. In the drawings, transistors depicted with a symbol used for a transistor Tr1 in FIG. 2 are of a depletion type (D-ch FET) while transistors depicted with a symbol used for a transistor Tr2 are of an enhancement type (E-ch FET). The same applies to the subsequent drawings.

Before describing the operations of the generator of the present invention, the basic principles of operations of a negative voltage generator (charge pumping type DC-DC negative voltage converter) will be described.

Figure 4A:
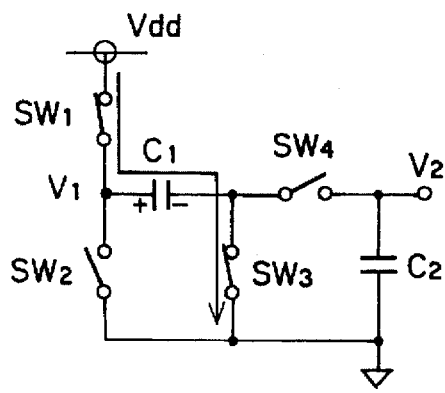
FIGS. 4A, 4B, and 4C are diagrams illustrating the principles of operations of a negative voltage generator.
Figure 4B:
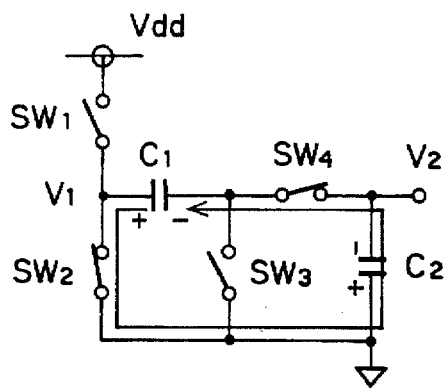
Figure 4C:
Figure 4C:
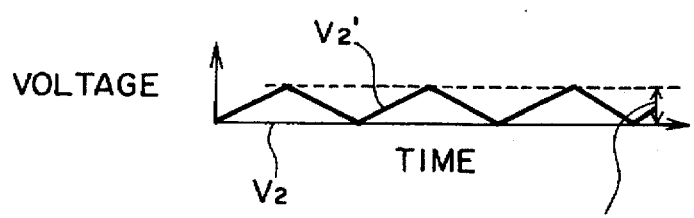

FIGS. 4A, 4B, and 4C show the principles of operations of a charge pumping type DC-DC negative voltage converter. In FIGS. 4A and 4B, SW1 to SW4 denote switches. C1 denotes a pumping capacitor. C2 denotes a smoothing capacitor. In FIG. 4A, when the switches SW1 and SW3 are on and the switches SW2 and SW4 are off, the pumping capacitor C1 is charged, as illustrated. This shall be called mode I.

As shown in FIG. 4B, when the switches SW1 and SW3 are turned off and the switches SW2 and SW4 are turned on, a charge stored in the pumping capacitor C1 is discharged, as illustrated, and the smoothing capacitor C2 is charged. At this time, the polarity of the charge stored in the smoothing capacitor C2 is opposite to that of the charge stored in the pumping capacitor C1. A negative voltage is developed at an output voltage terminal V2. This shall be called mode II.

By repeating the modes I and II alternately, a negative voltage is stored in the smoothing capacitor C2. This charge-pumping operation resembling a bucket relay race brings about a ripple as shown in FIG. 4C in the output voltage V2. For example, when the capacitance of the smoothing capacitor C2 is large enough and the capacitive reactance thereof is negligible, a ripple V2' shown in FIG. 4C which results from charging and discharging occurs. Assuming that an output current is Io and a frequency to be selected by a switch is f, the magnitude ΔV of the ripple is expressed as follows:

$$\Delta V = Io/(f \cdot C1) \quad (4)$$

According to the expression (4), it is apparent that the ripple can be minimized by sufficiently increasing the capacitances of the capacitors C1 and C2 or by raising the frequency f.

Figure 5A:
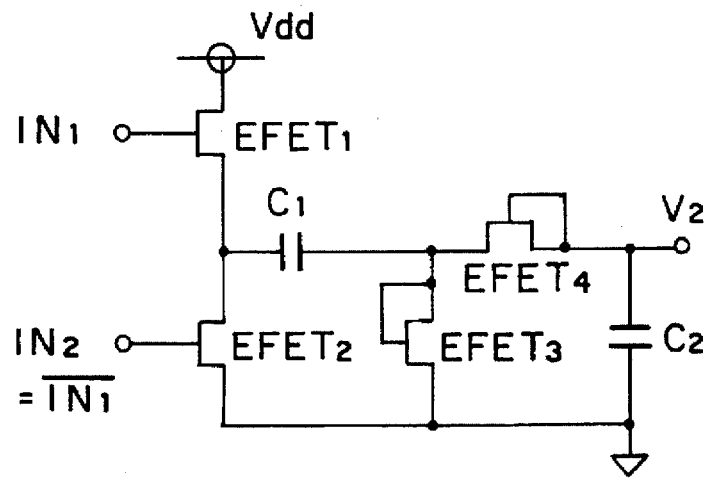
FIGS. 5A and 5B are circuit diagrams showing examples of the circuitry of a charge pump circuit for the negative voltage generator.

FIG. 5A shows an example of he foregoing charge pump circuit for a negative voltage generator which is configured using GaAs MESFETs. In FIG. 5A, EFET1 to EFET4 denote enhancement FETs. C1 and C2 denote a pumping capacitor and smoothing capacitor. IN1 and IN2 (=IN1 bar) denote, respectively input signals and are mutually complementary. VDD denotes a power supply, and V2 denotes a negative voltage to be output. In the circuit of FIG. 5A, a ripple occurs in an output voltage as described in conjunction with FIG. 4C.

Figure 5B:
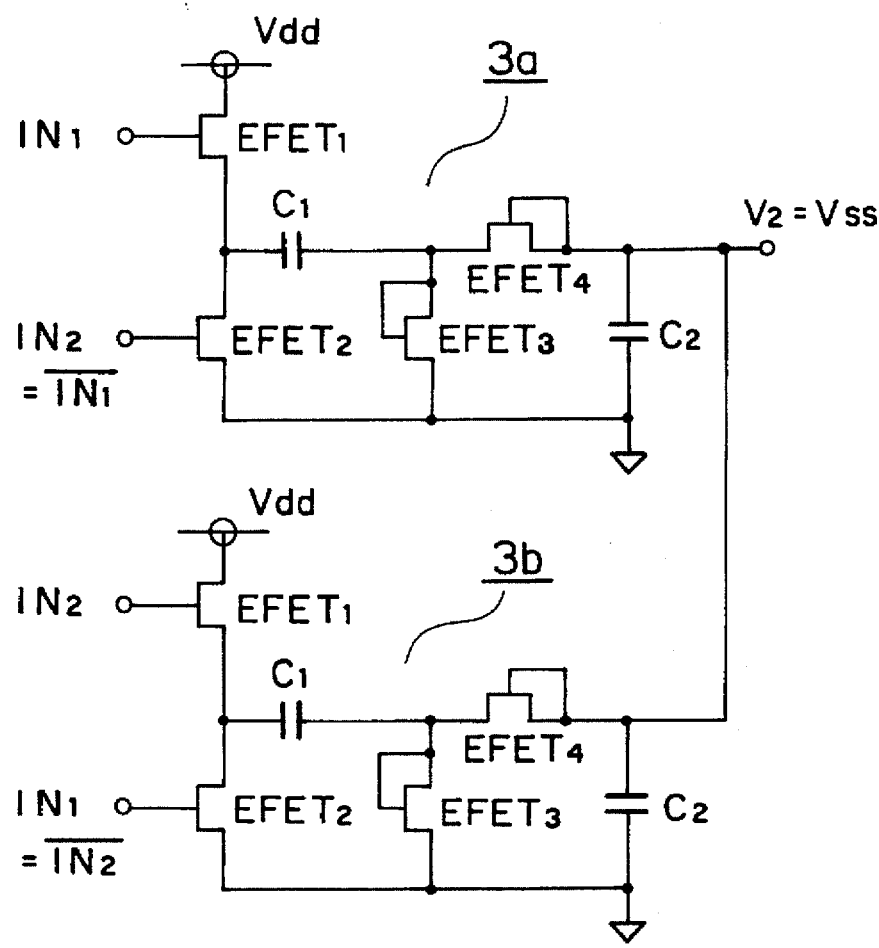

In an effort to avoid the ripple, according to the present invention, two charge pump circuits 3a and 3b are included and operated complementarily. FIG. 5B shows this circuitry. In FIG. 5B, the reference numerals denote the same circuit elements as those in FIG. 5A. The enhancement FETs EFET1 and EFET2 in each of the charge pump circuits 3a and 3b in FIG. 5B correspond to subsections 2Ba and 2Bb shown in FIG. 2.

When the complementary circuit shown in FIG. 5B is adopted, the two charge pump circuits 3a and 3b operate while canceling out ripples in voltages each of which is as shown in FIG. 4C. This circuit can therefore suppress a ripple occurring in an output voltage V2.

In FIG. 1, the oscillator buffer 1 forms an oscillating signal means. The drive circuits 2a and 2b and charge pump circuits 3a and 3b form a negative voltage generating means. The level control circuit 4 forms a level control means. The outputs Vout 1 and Vout 2 (=Vout1 bar) correspond to an oscillating signal and its complementary signal.

Second Embodiment

Figure 6A:
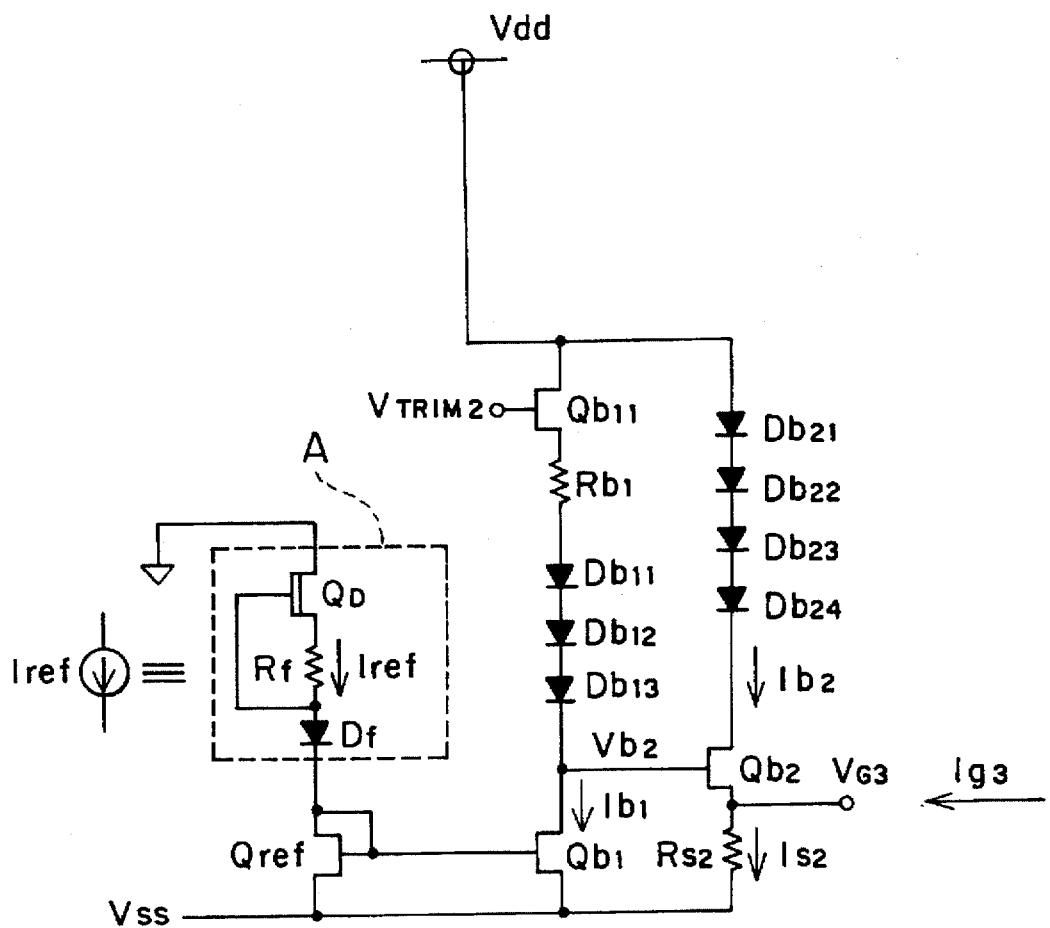
FIGS. 6A and 6B illustrate the principles and circuitry of a level control circuit employed in a negative voltage generator of the second embodiment.
Figure 12:
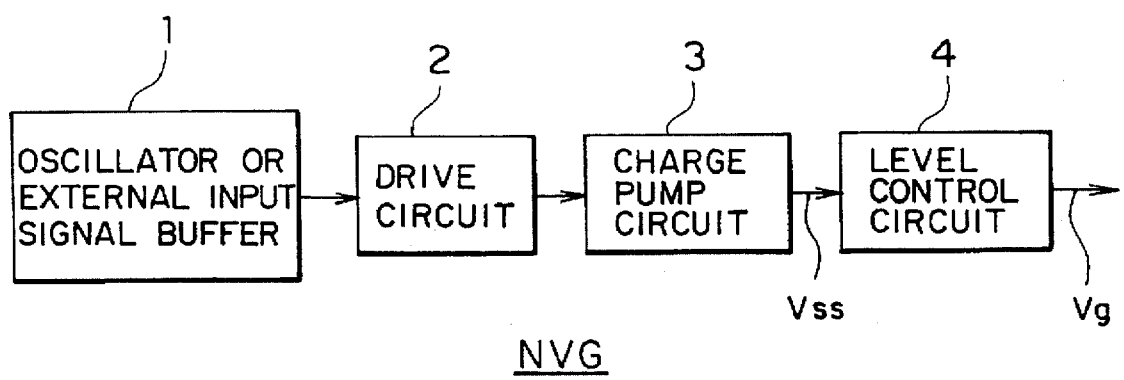
FIG. 12 is a block diagram showing the configuration of a typical negative voltage generator.
Figure 13:
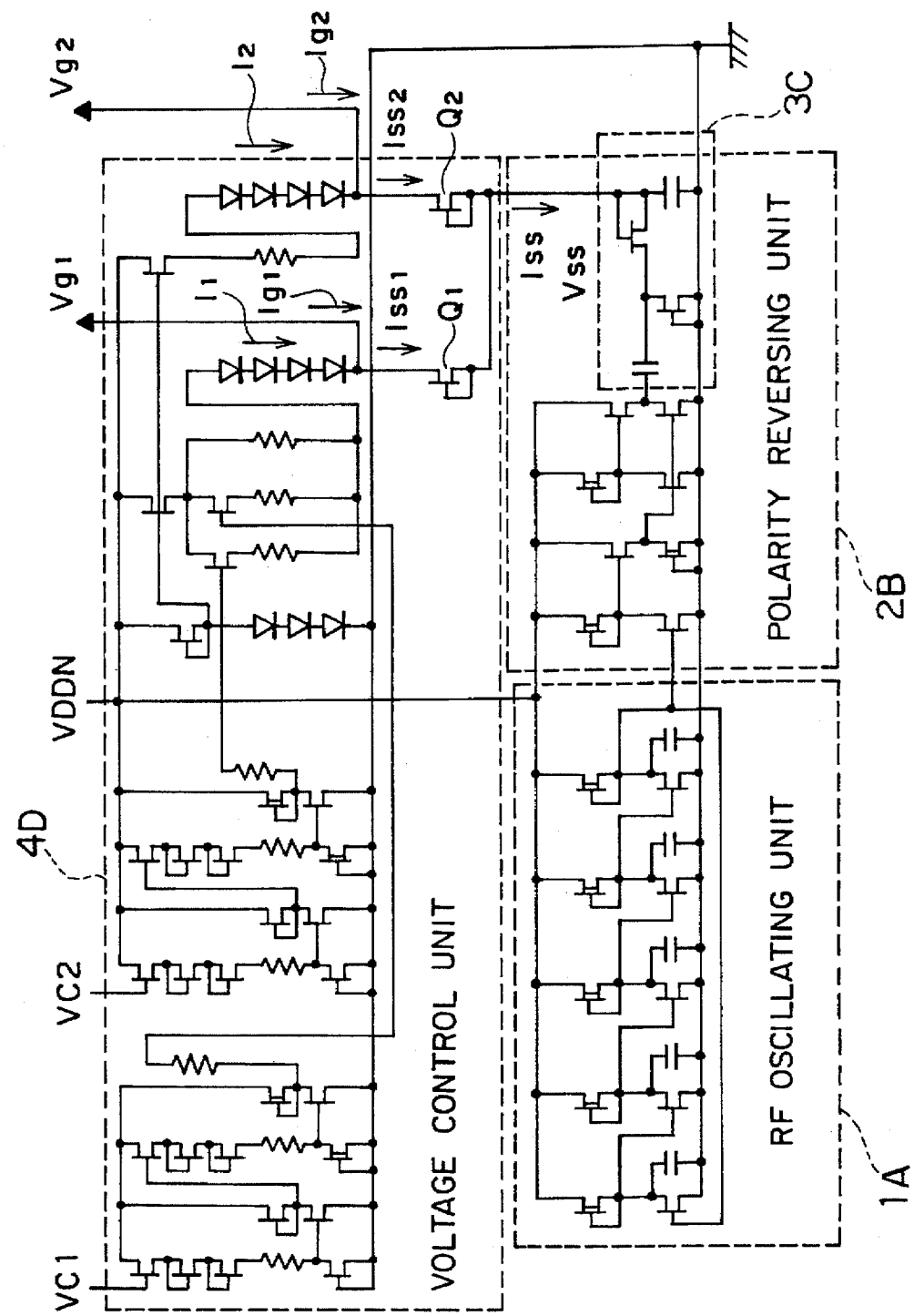
FIG. 13 is a circuit diagram showing a conventional negative voltage generator.

FIG. 6A is a circuit diagram showing an example of a level control circuit for a negative voltage generator in accordance with another embodiment of the present invention which can minimize a variation of an output voltage occurring when an output current (gate current in an FET amplifier) flows. The overall circuitry of a negative voltage generator of this embodiment may be identical to the one shown in FIG. 1 or FIG. 12. In a level control circuit 4a in FIG. 6A, Vg3 denotes a gate bias voltage of an FET in, for example, the last stage of an FET amplifier. Ig3 denotes an output current (gate current of the FET in the last stage). Ib1, Ib2, and Is2 denote branch currents of this circuit. Vss denotes a negative voltage (corresponding to a voltage V2 in FIG. 5) stored by a charge pump circuit.

QD denotes a depletion FET serving as a constant-current source. Qref, Qb11, Qb1, and Qb2 denote enhancement FETs. Df, Db11 to Db13, and Db21 to Db24 denote diodes. Rs2, Rb1, and Rf denote resistors. Vdd denotes a potential at a power supply. $V_{TRIM2}$ denotes an external reference voltage terminal used to set the level of the gate bias voltage Vg3.

In the circuit of FIG. 6A, a series circuit composed of the depletion FET QD, resistor Rf, diode Df, and enhancement FET Qref, and the enhancement FET Qb1 form a current mirror circuit. Consequently, the following relationship is established irrespective of the negative voltage Vss:

$$Ib1 = \alpha Iref \quad (5)$$

where α denotes a constant that is a value determined with the ratio of the width of the gate of the enhancement FET Qref to that of the enhancement FET Qb1. A section A in FIG. 6A may be formed with a constant-current source having another circuitry.

Figure 6B:
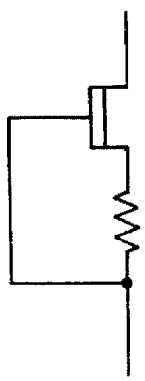

The enhancement FET Qb2 forms a source follower whose load is a load resistor (resistive load) Rs2 or a constant-current source (constant-current load) composed of a depletion FET and resistor as shown in FIG. 6B. The gate voltage Vb2 of the FET Qb2 is determined with the current Ib1 flowing through the external reference voltage terminal $V_{TRIM2}$ and enhancement FET Qb1. Herein, the enhancement FET Qb2 has such a sufficient transconductance that a gate-source voltage of the FET Qb2 will hardly vary depending on the value of the current Ib2.

The external reference voltage terminal $V_{TRIM2}$ forms an external input voltage terminal.

Owing to the foregoing circuitry, the current Ib1 keeps a constant value. When the external reference voltage terminal $V_{TRIM2}$ is fixed to a certain potential, the voltage Vb2 becomes constant. A voltage that has dropped by the gate-source voltage of the enhancement FET Qb2 from the gate voltage Vb2 is always output as the gate bias voltage Vg3 that is an output of the source follower.

Assume that the gate current Ig3 flows. As apparent from FIG. 6A, the currents Ig3, Ib2, and Is2 have the following relationship:

$$Is2 = Ib2 + Ig3 \quad (6)$$

When the gate current Ig3 flows, since the gate voltage Vb2 is constant, the current Is2 is substantially constant. The current Ib2 diminishes by the flowing gate current Ig3.

However, since the output voltage Vg3 is an output of the source follower composed of the enhancement FET Qb2 and load resistor Rs2 or constant-current source, the output voltage Vg3 is retained at a substantially constant value owing to the voltage Vb2 until the current Ig3 gets larger than the current Is2 that is pre-set to flow into the load resistor Rs2 or constant-current source. When the current Ig3 becomes substantially equal to or larger than the current Is2, the current Is2 becomes equal to or larger than a pre-set value. Consequently, a large voltage drop occurs at the load resistor Rs2. This causes the potential at the terminal Vg3 to rise. In other words, the output voltage Vg3 varies.

Figure 14:
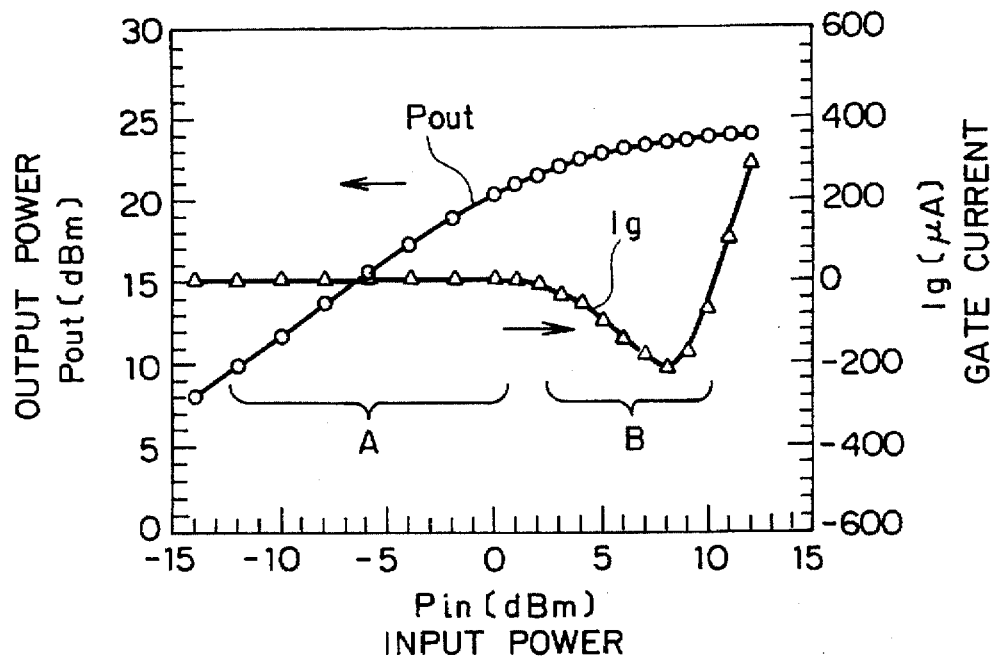
FIG. 14 is a graph indicating input/output characteristics of an FET employed in a typical FET amplifier.

When the output current Ig3 flows in a direction opposite to the direction indicated in FIG. 6A (or when the gate current has passed the state plotted as the area B in FIG. 14 and flows in a positive direction), the enhancement FET Qb2 of the source follower operates normally so as to feed a current to the load. The output voltage Vg3 therefore does not vary in level very much.

As mentioned above, when the level control circuit 4a in this embodiment is used, the variation of the output voltage Vg3 can be minimized until the output current Ig3 exceeds the pre-set value of the current Is2.

Figure 7:
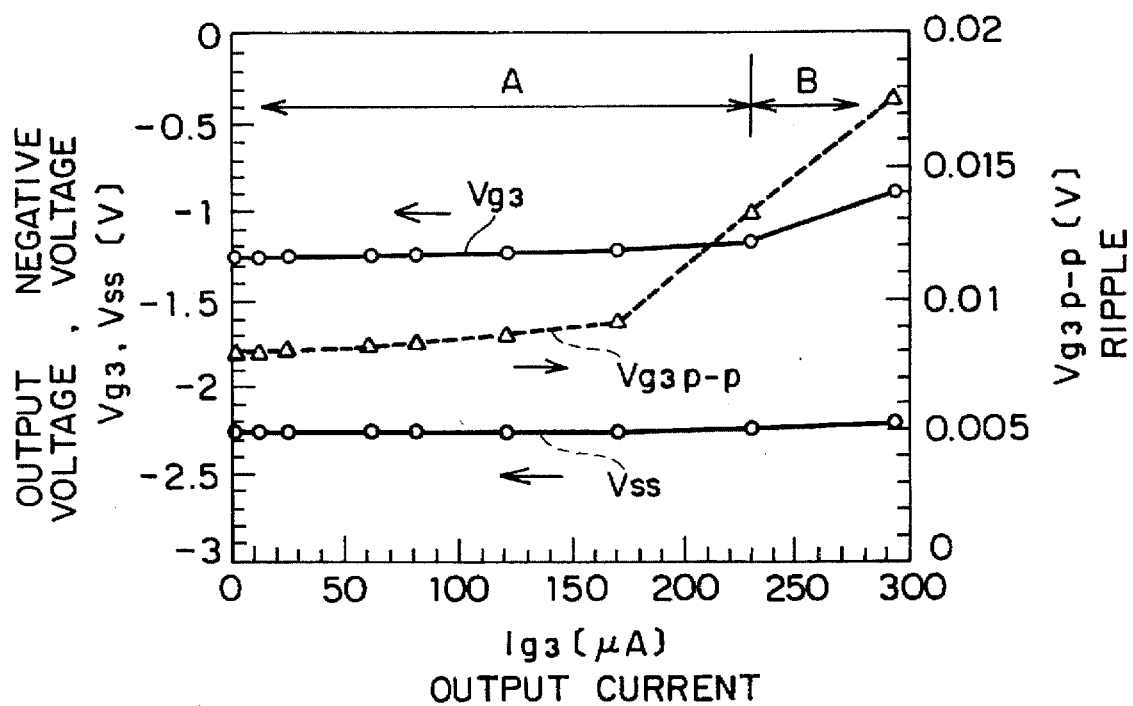
FIG. 7 is a graph indicating an output characteristic of a negative voltage generator, in which the complementary circuitry of the first embodiment is combined with the level control circuit in the second embodiment.

FIG. 7 shows an example of the results of simulation performed on the circuitry of the first embodiment shown in FIG. 1 combined with the level control circuit in the second embodiment shown in FIG. 6A. In FIG. 7, the axis of abscissae indicates the output current Ig3, the left-hand axis of ordinates indicates the output voltage Vg3 and stored negative voltage Vss, and the right-hand axis of ordinates indicates the ripple Vg3p-p in the output voltage Vg3.

Figure 15:
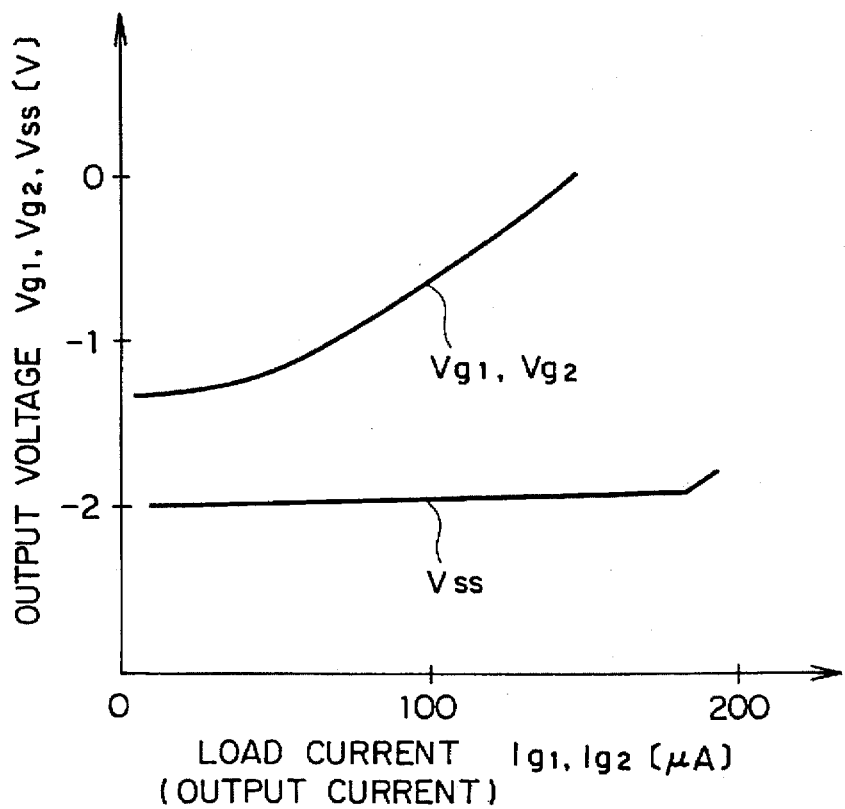
FIG. 15 is a graph indicating an output characteristic of a conventional negative voltage generator.

As apparent from FIG. 7, the variation of the output voltage Vg3 caused by the output current Ig3 is suppressed under the conditions corresponding to an area A. When the output current Ig3 exceeds the set value 230 μA of the current Is2, the output voltage Vg3 starts rising as it is plotted in an area B. This output characteristic is drastically improved compared with that of the known generator shown in FIG. 15

Owing to the complementary circuitry, the ripple Vg3p-p contained in the output voltage Vg3 is as low as 0.01 V or lower.

FIG. 6A shows the circuitry concerning the gate bias voltage VG3 of an FET in the last stage of an FET amplifier. If an FET amplifier comprises three stages of amplifiers, one or two circuits each composed of the enhancement FETs Qb11, Qb1, and Qb2, diodes Db11 to Db13 and Db21 to Db24, resistors Rs2 and Rb1, and external reference voltage terminal $V_{TRIM2}$ are connected in parallel in the first and second stages. The gates of the enhancement FETs Qb1 in the circuits are connected in common to the gate of the enhancement-mode FET Qref, thus constituting current mirrors.

Third Embodiment

Figure 8:
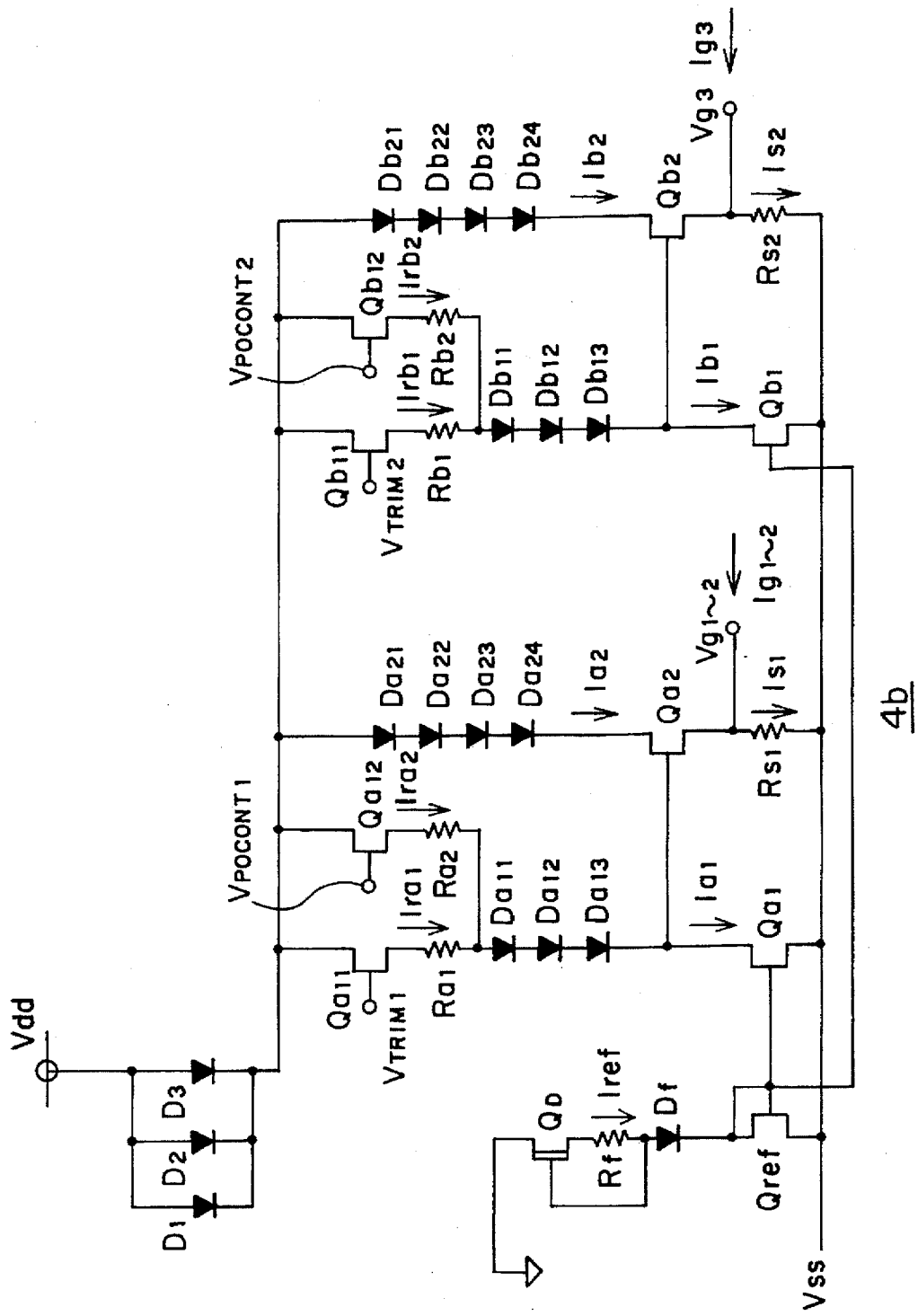
FIG. 8 illustrates the principles and circuitry of a level control circuit employed in a negative voltage generator of the second embodiment.

FIG. 8 shows a level control circuit 4b for a negative voltage generator of yet another embodiment of the present invention. A branch circuit through which a constant current flows independently of the negative voltage Vss owing to the current mirror in the level control circuit 4a in FIG. 6 (a branch circuit through which the current Ib1 flows as shown in FIG. 6A) is provided with a control voltage terminal $V_{POCONT2}$ that is connected in parallel with the external reference voltage terminal $V_{TRIM2}$. This makes it possible to adjust a bias current (idling current) in a GaAs FET amplifier. Moreover, during amplification, an output power can be regulated by means of a control voltage.

In FIG. 8, assuming that the GaAs FET amplifier is a three-stage amplifier, an FET gate bias voltage terminal Vg1-2 is provided in common for the first and second stages, and an FET gate bias voltage terminal Vg3 is provided for the third (last) stage.

In FIG. 8, Qa11, Qa12, Qb11, Qb12, Qref, Qa1, Qb1, Qa2, and Qb2 denote enhancement FETs. QD denotes a depletion FET. Rs1, Rs2, Ra1, Rb1, Ra2, Rb2, and Rf denote resistors. Df, D1 to D3, Da11 to Da13, Da21 to Da24, Db11 to Db13, and Db21 to Db24 denote diodes. Vdd denotes the potential at a power supply. $V_{TRIM1}$ and $V_{TRIM2}$ denote external reference voltage terminals for use in finely adjusting the levels of the output voltages Vg1-2 and Vg3.

$V_{POCONT1}$ and $V_{POCONT2}$ denote control voltage terminals for use in lowering the operating bias voltages for the output voltages Vg1-2 and Vg3 (shifting the voltages in a negative direction) and thus suppressing an output of the FET amplifier (this operation shall be referred to as an ATT operation). Vss denotes a stored negative voltage. Ia1, Ia2, Is1, Ib1, Ib2, Ira1, Ira2, Irb1, and Irb2 denote branch currents. Ig1-2 and Ig3 denote output currents.

Load resistors Rs1 and Rs2 may each be replaced with, for example, a constant-current source composed of a depletion FET and resistor as shown in FIG. 6B.

The external reference voltage terminals $V_{TRIM1}$ and $V_{TRIM2}$ and the control voltage terminals $V_{POCONT1}$ and $V_{POCONT2}$ form an external input voltage terminal.

A series circuit composed of the depletion FET QD, resistor Rf, diode Df, and enhancement FET Qref, and each of the enhancement FETs Qa1 and Qb1 form a current mirror. Consequently, the following relationship is established irrespective of the negative voltage Vss:

$$Ia1=Ib1=\alpha\, Iref \quad (7)$$

where $\alpha$ denotes a constant that is a value determined with the ratio of the width of the gate of the enhancement FET Qref to that of the gates of the enhancement FETs Qa1 and Qb1. As for the variations of output voltages caused by output currents in this circuit, as described in the second embodiment, the output voltages Vg1-2 and Vg3 are retained at a substantially constant value owing to a feedback effect as long as the currents Ig1-2 and Ig3 will not get so large as to exceed the pre-set value of the currents Is1 and Is2.

Two kinds of voltage terminals are included in the level control circuit 4b, namely the external reference voltage terminals $V_{TRIM1}$ and $V_{TRIM2}$ for use in finely adjusting the levels of the output voltages Vg1-2 and Vg3, and the control voltage terminals $V_{POCONT1}$ and $V_{POCONT2}$ for use in performing the ATT operation (the ATT operation is performed in order to lower a bias voltage in an FET amplifier so that efficiency deterioration can be prevented from occurring when the input level of the FET amplifier is lowered by 10 to 20 dB in order to decrease the output level of the FET amplifier by 10 to 20 dB). When configured as a current distribution type circuit, the level control circuit 4b can realize fine adjustment of output voltages and execution of the ATT operation (switching of operation modes). The operations of the level control circuit 4b will be described below.

The current Ia1 flowing into the enhancement FET Qa1 is branched out to a series circuit composed of the enhancement FET Qa11 and resistor Ra1 and a series circuit composed of the enhancement FET Qa12 and resistor Ra2. The current Ib1 flowing into the enhancement FET Qb1 is branched out to a series circuit composed of the enhancement FET Qb11 and resistor Rb1 and a series circuit composed of the enhancement FET Qb12 and resistor Rb2. The following relationships are established:

$$Ira1+Ira2=Ia1=constant$$
$$Irb1+Irb2=Ib1=constant \quad (8)$$

Assuming that each of the pairs of the enhancement FETs Qa11 and Qa12, resistors Ra1 and Ra2, enhancement FETs Qb11 and Qb12, and resistors Rb1 and Rb2 are electrically identical to each other, if the external reference voltages $V_{TRIM2}$ and $V_{TRIM2}$ and the control voltages $V_{POCONT1}$ and $V_{POCONT2}$ have the same value, the following relationships are established:

$$Ira1=Ira2=(Ia1)/2$$
$$Irb1=Irb2=(Ib1)/2 \quad (9)$$

When the control voltages $V_{POCONT1}$ and $V_{POCONT2}$ are lowered from a standard value (for example, ½ of the supply voltage Vdd) to 0 V, the Ira2 and Irb2 values become zero. According to the expressions (8), Ira1=Ia1 and Irb1=Ib2 are established. Consequently, the voltage drops occurring at the resistors Ra1 and Ra2, and the resistors Rb1 and Rb2 are doubled. As a result, the gate voltages of the enhancement FETs Qa2 and Qb2 are lowered by the voltage drops. This leads to lower output voltages. Thus, the ATT operation mode can be realized.

When the control voltages $V_{POCONT1}$ and $V_{POCONT2}$ are fixed to a standard value, if the external reference voltages $V_{TRIM1}$ and $V_{TRIM2}$ are raised or lowered from a standard value (the same as the one for the control voltages $V_{POCONT1}$ and $V_{POCONT2}$: for example, ½ of the supply voltage Vdd), the output voltages Vg1-2 and Vg3 can be finely adjusted according to the principle of a voltage drop resulting from current distribution which also enables the ATT operation mode.

The principles of operations of the level control circuit 4b for realizing the fine adjustment of a gate bias voltage in an FET amplifier and the ATT operation of the FET amplifier has been described above.

Figure 9:
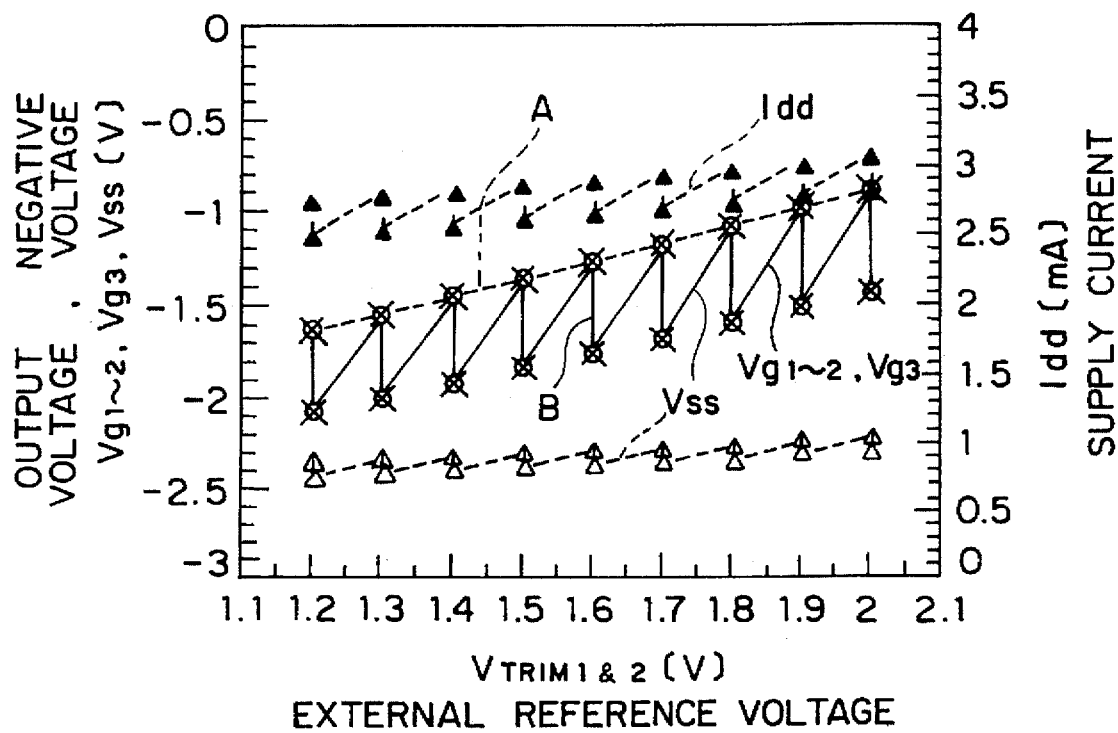
FIG. 9 is a graph indicating an output characteristic of a negative voltage generator of the fifth embodiment provided as a result of simulation.

FIG. 9 shows the variation (A) of the output voltage Vg1-2 (Vg3) occurring when the external reference voltage V=hd TRIM1($V_{TRIM2}$) for bias fine adjustment is changed, and the variation (B) of the output voltage Vg1-2 (Vg3) occurring when the control voltage $V_{POCONT1}$ ($V_{POCONT1}$) is changed from a standard value to 0 V relative to each value of the external reference voltage $V_{TRIM1}$ (=$V_{TRIM2}$).

The axis of abscissae indicates the external reference voltage $V_{TRIM1}$ or $V_{TRIM2}$, the left-hand axis of ordinates indicates the output voltage Vg1-2 or Vg3, and the right-hand axis of ordinates indicates the supply current Idd.

As apparent from the drawing, when the external reference voltage $V_{TRIM1}$ (=$V_{TRIM2}$) for bias fine adjustment is changed, the output voltage Vg1-2 or Vg3 varies. When the control voltage $V_{POCONT1}$ (=$V_{POCONT2}$) is changed, the output voltage Vg1-2 or Vg3 is lowered greatly.

This function will be helpful in controlling a bias voltage in an FET amplifier using a negative voltage generator in practice.

Fourth Embodiment

When an FET amplifier is integrated with a negative voltage generator, a desired gate bias voltage is often greatly different from that of another FET amplifier because of the difference of a threshold voltage Vth of FETs employed in the FET amplifier from that of FETs employed in another FET amplifier. Whether or not the difference can be minimized greatly affects a yield of the mass production of the FET amplifier.

The aforesaid third embodiment has proposed the circuitry enabling adjustment of the difference.

In the fourth embodiment, in an effort to minimize the magnitude of an adjustment or obviate the necessity of the adjustment, the depletion FET QD serving as a constant-current source for the level control circuit shown in FIG. 6 or 8 is formed with the same kind of FET as the FETs employed in an FET amplifier.

A current mirror operates according to the difference of the threshold voltage Vth of amplification FETs in an FET amplifier from that in another FET amplifier. The output voltages Vg1-2 and Vg3 therefore vary proportionally to the difference of the threshold voltage Vth. Consequently, when a negative voltage generator is integrated with an FET amplifier and mounted on one chip, if a depletion FET QD serving as a constant-current source for a level control circuit in the negative voltage generator is formed with the same kind of FET as the amplification FETs employed in an FET amplifier, it becomes possible to minimize the magnitude of an adjustment of a gate bias voltage or obviate the necessity of the adjustment.

Fifth Embodiment

Figure 10:
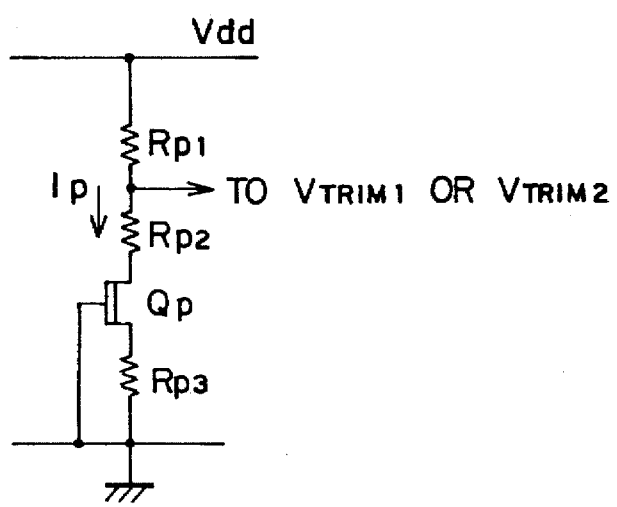
FIG. 10 is a circuit diagram showing an example of the circuitry of a constant voltage feeding circuit employed in a negative voltage generator of the fifth embodiment.
Figure 11:
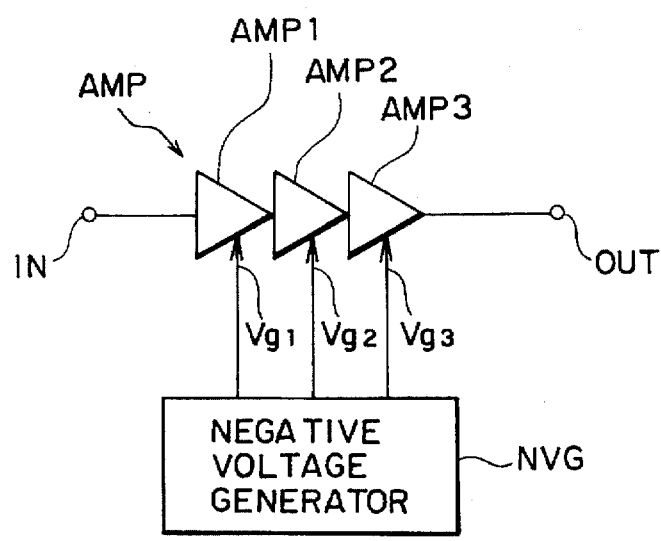
FIG. 11 is a diagram showing the configuration employed when a negative voltage generator and FET amplifier are used in combination.

For accomplishing the same object as the fourth embodiment, in this embodiment, a constant-voltage feeding circuit 10 shown in FIG. 10 is connected to each of the external reference voltage terminals $V_{TRIM1}$ and $V_{TRIM2}$ of the level control circuit shown in FIG. 6 or 8.

In FIG. 10, Rp1, Rp2, and Rp3 denote resistors. QP denotes an FET of the same kind as the FETs in an FET amplifier. Since the FET QP is manufactured using the same kind of FET as the FETs employed in an FET amplifier, a current Ip varies according to the threshold voltage Vth of the FET. Eventually, a voltage drop Rp1·Ip varies.

Thus, an FET amplifier is integrated with a negative voltage generator and mounted on one chip, the constant-voltage feeding circuit 10 for feeding a constant voltage is connected to the external reference voltage terminals $V_{TRIM1}$ and $V_{TRIM2}$ for voltage adjustment in the level control circuit of the negative voltage generator, and the depletion FET Qp used as a constant-current unit of the constant-voltage feeding circuit 10 is formed with the same kind of FET as the amplification FETs employed in the FET amplifier. This makes it possible to minimize the magnitude of an adjustment of a gate bias voltage or obviate the necessity of the adjustment.

As described so far, the first and second aspects of the present invention have the advantage of providing such a negative voltage generator that: since circuits for generating a negative voltage are made mutually complementary, two charge pump circuits operate to cancel out ripples; the occurrence of a ripple in an output voltage can therefore be suppressed and a negative voltage can eventually be supplied more stably; when the negative voltage generator is connected to, for example, an FET amplifier in order to supply a gate bias voltage to each amplification FET, an unwanted spurious component that may be contained in an output of the FET amplifier can be removed.

The third and sixth aspects of the present invention have the advantage of providing such a negative voltage generator that: a level control means uses a transistor, which determines an output voltage using the level of a generated negative voltage as a common level, as a source follower having either a resistive load or constant-current load as a load, and includes a current mirror for stabilizing the gate voltage of the transistor; and a variation of an output voltage induced by an output current can therefore be minimized and a negative voltage can eventually be supplied more stably.

The fourth and seventh aspects of the present invention have the advantage of providing a negative voltage generator in accordance with the third and sixth aspects, wherein a branch circuit through which a constant current flows independently of a negative voltage owing to a current mirror and which is connected to the gate of the transistor is provided with an external input voltage terminal to which a voltage is applied externally in order to adjust an output voltage, so that an output negative voltage can be finely adjusted.

The fifth and eighth aspects of the present invention have the advantage of providing a negative voltage generator in accordance with the third and sixth aspects, wherein a branch circuit through which a constant current flows independently of a negative voltage owing to a current mirror is provided with two current distributing circuits each composed of an external input voltage terminal and resistor, so that a bias current in an FET amplifier can be adjusted when the negative voltage generator is connected to the FET amplifier in order to supply a negative voltage, and so that an output power can be regulated during amplification.

The ninth aspects of the present invention has the advantage of providing a negative voltage generator in accordance with the third and sixth aspects, wherein the negative voltage generator is integrated with the FET amplifier to which a negative voltage is supplied using one chip, and an FET serving as a constant-current unit of a current mirror is formed with the same kind of FET as the FETs employed in the FET amplifier, so that the magnitude of an adjustment of a gate bias voltage needed because of the difference of a threshold voltage of FETs in an FET amplifier from that in another FET amplifier can be minimized or the necessity of the adjustment can be obviated.

The tenth aspect of the present invention has the advantage of providing a negative voltage generator in accordance with the fourth and seventh aspects, wherein the negative voltage generator is integrated with the FET amplifier into which a negative voltage is supplied using one chip, a constant-voltage feeding circuit composed of a resistor and constant-voltage unit and designed to apply a constant voltage is connected to an external input voltage terminal, and an FET serving as a constant-current unit of the constant-voltage feeding circuit is formed with the same kind of FET as the FETs employed in the FET amplifier, so that the magnitude of an adjustment of a gate bias voltage needed because of the difference of a threshold voltage of FETs in an FET amplifier from that in another FET amplifier can be minimized or the necessity of the adjustment can be obviated.

What is claimed is:

1. A negative voltage generator comprising:

oscillating signal means for providing an oscillating signal and a complementary oscillating signal;

negative voltage generating means including a pair of drive circuits for amplifying the oscillating signal and the complementary oscillating signal, respectively, and a pair of charge pump circuits that reverse polarities of outputs of said pair of drive circuits, the charge pump circuits having respective output terminals that are connected together, said negative voltage generating means combining signals produced by reversing the polarities of the oscillating and complementary oscillating signals, thus generating a negative voltage; and level control means for converting the level of the negative voltage and supplying a resultant voltage as an output voltage.

2. A negative voltage generator comprising:

oscillating signal means for providing an oscillating signal and a complementary oscillating signal;

negative voltage generating means for amplifying the oscillating signal and the complementary oscillating signal, and for combining signals produced by reversing the polarities of the oscillating and complementary oscillating signals, thus generating a negative voltage; and level control means for converting the level of the negative voltage and supplying a resultant voltage as an output voltage, said level control means including a source follower transistor circuit for determining the output voltage using the negative voltage as a common level, said source follower transistor circuit having either a resistive load or a constant-current load to minimize variation of the output voltage induced by an output current, and including a current mirror circuit for stabilizing a gate voltage of said source follower transistor circuit.

3. The negative voltage generator according to claim 1, wherein said level control means includes a source follower transistor circuit for determining the output voltage using the negative voltage as a common level, said source follower transistor circuit having either a resistive load or a constant-current load to minimize variation of the output voltage induced by an output current, and including a current mirror circuit for stabilizing a gate voltage of said source follower transistor circuit.

4. The negative voltage generator according to claim 2, wherein said negative voltage generator is integrated with an FET amplifier, to which a negative voltage is supplied, on one chip, and an FET serving as a constant-current unit of said current mirror is formed with the same kind of FET as FETs employed in said FET amplifier.

5. The negative voltage generator according to claim 2, including a branch circuit through which a constant current flows independently of the negative voltage owing to said current mirror circuit and which is connected to a gate of said source follower transistor circuit and includes an external input voltage terminal to which a voltage is applied to adjust the output voltage.

6. The negative voltage generator according to claim 2, including a branch circuit through which a constant current flows independently of the negative voltage owing to said current mirror circuit having two current distributing circuits, each current distributing circuit including an external input voltage terminal and resistor, so that a bias current in an FET amplifier can be adjusted when said negative voltage generator is connected to the FET amplifier in order to supply the negative voltage, and so that output power can be adjusted during amplification.

7. The negative voltage generator according to claim 5, wherein said negative voltage generator is integrated with an FET amplifier, to which the negative voltage is supplied, on one chip, a constant-voltage feeding circuit including a resistor and constant-current unit for applying a constant voltage and connected to said external input voltage terminal, and an FET serving as said constant-current unit is formed with the same kind of FET as FETs employed in said FET amplifier.

8. A negative voltage generator, comprising:

oscillating signal means for providing an oscillating signal;

negative voltage generating means for amplifying the oscillating signal, for reversing polarity of the oscillating signal, and for generating a negative voltage; and level control means for converting the level of the negative voltage and supplying a resultant voltage as an output voltage wherein said level control means includes a source follower transistor circuit for determining an output voltage using the negative voltage as a common level, said source follower transistor circuit having either a resistive load or a constant-current load to minimize variation of the output voltage induced by an output current, and said source follower transistor circuit includes a current mirror circuit for stabilizing a gate voltage of said source follower transistor circuit.

9. The negative voltage generator according to claim 8, including a branch circuit through which a constant current flows independently of the negative voltage owing to said current mirror circuit and which is connected to a gate of said source follower transistor circuit and includes an external input voltage terminal to which a voltage is applied to adjust the output voltage.

10. The negative voltage generator according to claim 8, including a branch circuit through which a constant current flows independently of the negative voltage owing to said current mirror circuit having two current distributing circuits, each current distributing circuit including an external input voltage terminal and resistor, so that a bias current in an FET amplifier can be adjusted when said negative voltage generator is connected to the FET amplifier in order to supply the negative voltage, and so that output power can be adjusted during amplification.

11. The negative voltage generator according to claim 8, wherein said negative voltage generator is integrated with an FET amplifier, to which the negative voltage is supplied, on one chip, and an FET serving as a constant-current unit of said current mirror is formed with the same kind of FET as FETs employed in said FET amplifier.

12. The negative voltage generator according to claim 9, wherein said negative voltage generator is integrated with an FET amplifier, to which the negative voltage is supplied, on one chip, a constant-voltage feeding circuit including a resistor and constant-current unit for adding a constant voltage and connected to said external input voltage terminal, and an FET serving as said constant-current unit is formed with the same kind of FET as FETs employed in said FET amplifier.

* * * * *

UNITED STATES PATENT AND TRADEMARK OFFICE
CERTIFICATE OF CORRECTION

PATENT NO. : 5,699,018
DATED : December 16, 1997
INVENTOR(S) : Yamamoto et al.

It is certified that error appears in the above-identified patent and that said Letters Patent is hereby corrected as shown below:

Column 14, Line 59, change "adding" to --applying--.

Signed and Sealed this

Fourteenth Day of July, 1998

Attest:

BRUCE LEHMAN

Attesting Officer    Commissioner of Patents and Trademarks